(12) United States Patent
Haraguchi (10) Patent No.: US 11,222,763 B2
(45) Date of Patent: Jan. 11, 2022

(54) TEMPERATURE FUSE AND ELECTRICAL JUNCTION BOX

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Akira Haraguchi, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 246 days.

(21) Appl. No.: 16/488,055

(22) PCT Filed: Feb. 6, 2018

(86) PCT No.: PCT/JP2018/003954
§ 371 (c)(1),
(2) Date: Aug. 22, 2019

(87) PCT Pub. No.: WO2018/155161
PCT Pub. Date: Aug. 30, 2018

(65) Prior Publication Data
US 2020/0066472 A1    Feb. 27, 2020

(30) Foreign Application Priority Data
Feb. 27, 2017    (JP) .............................. JP2017-035233

(51) Int. Cl.
*H01H 85/143*    (2006.01)
*H01H 85/08*     (2006.01)
(Continued)

(52) U.S. Cl.
CPC .......... *H01H 85/08* (2013.01); *H01H 85/143* (2013.01); *H01H 85/175* (2013.01);
(Continued)

(58) Field of Classification Search
CPC ...... H01H 85/08; H01H 85/143; H01H 85/10; H01H 85/0417; H01H 85/0241;
(Continued)

(56) References Cited

U.S. PATENT DOCUMENTS 3,251,968 A  *  5/1966  Cameron ............... H01H 85/47
                                                    337/161
7,172,462 B1     2/2007  Gronowicz, Jr.
(Continued)

FOREIGN PATENT DOCUMENTS

| JP | S55-062637 A | 5/1980 |
|---|---|---|
| JP | H11-339617 A | 12/1999 |
| JP | 2016-540343 A | 12/2016 |

OTHER PUBLICATIONS

International Search Report, Application No. PCT/JP2018/003954, dated May 1, 2018. ISA/Japan Patent Office.

*Primary Examiner* — Bryan R Perez
(74) *Attorney, Agent, or Firm* — Honigman LLP (57) ABSTRACT

A temperature fuse is ring-shaped and includes an insulation portion and a conductive portion arranged on an inner side and an outer side in a radial direction, and the conductive portion is formed of a thermal fuse element. An electrical junction box includes: a circuit board on which a switching element is mounted; a housing body for housing the circuit board; a conductive plate connected to the switching element, a first hole passing through the conductive plate; a terminal that is shaped as a plate and faces the conductive plate, a second hole passing through the terminal; the temperature fuse interposed between the conductive plate and the terminal in an axial direction, and a shaft-like
(Continued)

insertion body for being inserted into the temperature fuse, the first hole, and the second hole.

9 Claims, 7 Drawing Sheets

(51) Int. Cl.
    *H01H 85/175*     (2006.01)
    *H02H 3/08*     (2006.01)
    *H05K 5/00*     (2006.01)
    *B60R 16/023*     (2006.01)
    *H01R 4/30*     (2006.01)
    *H01R 11/12*     (2006.01)

(52) U.S. Cl.
    CPC ........... *H02H 3/085* (2013.01); *H05K 5/0069* (2013.01); *B60R 16/0238* (2013.01); *H01R 4/30* (2013.01); *H01R 11/12* (2013.01)

(58) Field of Classification Search
    CPC ...... H01H 85/175; H01H 37/76; H02H 3/085; H05K 5/0069; B60R 16/0238; B60R 16/03; H01R 4/30; H01R 4/363; H01R 11/12; H01R 13/684; H01R 13/688; H02G 3/16
    See application file for complete search history.

(56) References Cited

U.S. PATENT DOCUMENTS

| | | |
|---|---|---|
| 2016/0099458 A1 | 4/2016 | Tanaka et al. |
| 2016/0197462 A1* | 7/2016 | Hamada ................ H02G 3/088 174/50 |
| 2017/0006703 A1 | 1/2017 | Haraguchi et al. |

* cited by examiner

TEMPERATURE FUSE AND ELECTRICAL JUNCTION BOX

CROSS-REFERENCE TO RELATED APPLICATIONS

This application is the U.S. national stage of PCT/JP2018/003954 filed on Feb. 6, 2018, which claims priority of Japanese Patent Application No. JP 2017-035233 filed on Feb. 27, 2017, the contents of which are incorporated herein.

TECHNICAL FIELD

The present disclosure relates to a temperature fuse and an electrical junction box.

BACKGROUND

JP11-339617A discloses a temperature fuse in which a fuse element is contained in a tubular case and a conductive wire (lead wire) is connected using the fuse element. In the case where an electrical circuit of an electrical junction box is configured using this temperature fuse, if an overcurrent flows through the conductive wire, the overcurrent is interrupted by the temperature fuse melting down, and thus the overcurrent is prevented from flowing into a switching element. Accordingly, the switching element is protected from overheating.

Since the temperature fuse disclosed in JP11-339617A is connected to an intermediate portion of the conductive wire, it is difficult to mount the temperature fuse in a compact manner with a simple configuration, and if the temperature fuse is mounted, there is a risk that the electrical junction box will increase in size.

The present disclosure has been made in view of the above circumstances, and an object of the present disclosure is to provide a temperature fuse and an electrical junction box that can interrupt a current with a simple configuration.

SUMMARY

A temperature fuse according to an aspect of the present disclosure is ring-shaped and includes an insulation portion and a conductive portion arranged on an inner side and an outer side in a radial direction, and the conductive portion is formed of a thermal fuse element.

An electrical junction box according to an aspect of the present disclosure includes: a circuit board on which a switching element is mounted; a housing body for housing the circuit board; a conductive plate connected to the switching element, a first hole passing through the conductive plate; a terminal that is shaped as a plate and faces the conductive plate, a second hole passing through the terminal; the above-described temperature fuse interposed between the conductive plate and the terminal in an axial direction, and a shaft-like insertion body for being inserted into the temperature fuse, the first hole, and the second hole.

Advantageous Effects of Disclosure

According to the disclosure of the present application, it is possible to interrupt a current with a simple configuration.

DETAILED DESCRIPTION OF PREFERRED EMBODIMENTS

First, embodiments of the present disclosure will be listed and illustrated. At least some of the embodiments described below may also be combined as appropriate.

A temperature fuse according to one aspect of the present disclosure is ring-shaped and includes an insulating portion and a conductive portion arranged on an inner side an outer side in a radial direction, and the conductive portion is formed of a thermal fuse element.

In the temperature fuse according to one aspect of the present disclosure, there are two of the insulating portions, and the conductive portion is interposed between the two insulating portions.

The temperature fuse according to one aspect of the present disclosure is shaped as an incomplete ring.

The temperature fuse according to one aspect of the present disclosure includes two electrode plates, the insulating portion and the conductive portion being interposed therebetween in an axial direction, and the two electrode plates each having a through hole.

In the temperature fuse according to one aspect of the present disclosure, a hole passes through the electrode plates or the insulating portion.

An electrical junction box according to one aspect of the present disclosure includes: a circuit board on which a switching element is mounted; a housing body for housing the circuit board; a conductive plate connected to the switching element, a first hole passing through the conductive plate; a terminal that is shaped as a plate and faces the conductive plate, a second hole passing through the terminal; the above-described temperature fuse interposed between the conductive plate and the terminal in an axial direction, and a shaft-like insertion body that is inserted into the temperature fuse, the first hole, and the second hole.

The temperature fuse according to the one aspect of the present disclosure is ring-shaped and includes an insulation portion and a conductive portion arranged on an inner side an outer side in a radial direction, and the conductive portion is formed of a thermal fuse element. Accordingly, with the temperature fuse, when the two conductive members are to be connected with each other using a shaft-like member such as a bolt, the temperature fuse can be inserted into the shaft-like member and arranged between the two conductive members, and thus the attachment can be easily performed. Accordingly, it is possible to save space.

Also, when the temperature fuse is mounted, if an overcurrent flows through the two conductive members, the conductive portions melt, and the gap between the two conductive members are kept by the insulation portion, and thus the two conductive members are insulated. Accordingly, it is possible to interrupt a current with a simple configuration.

In the temperature fuse according to the one aspect of the present disclosure, there are two of the insulating portions, and the conductive portion is interposed between the two insulating portions, and thus it is possible to more reliably keep the insulated state.

The temperature fuse according to the one aspect of the present disclosure is shaped as an incomplete ring, and thus it is possible to easily attach the temperature fuse to a shaft-like member such as a bolt.

The temperature fuse according to the one aspect of the present disclosure includes two electrode plates that interposes the insulating portion and the conductive portion in the axial direction and that each have a through hole, and thus the conductive member can be connected to the electrode plates, making it easy to ensure the electrical connection via the temperature fuse.

With the temperature fuse according to the one aspect of the present disclosure, a hole passes through the electrode plates or the insulating portion. Accordingly, when the conductive portion melts, it is possible to cause the melted thermal fuse element flow out from the hole.

With the electrical junction box according to the one aspect of the present disclosure, the temperature fuse can be easily attached only by inserting into the insertion body, and thus making it possible to save space. Accordingly, the electrical junction box can be made smaller. Also, when an overcurrent flows through the terminal and the conductive body, it is possible to insulate the terminal and conductive body with the temperature fuse. Accordingly, it is possible to interrupt a current with a simple configuration.

Hereinafter, specific examples of the temperature fuse and the electrical junction box according to the embodiments of the present disclosure will be illustrated with reference to the drawings. Note, that the present disclosure is not intended to be limited to these examples, but is defined by the claims, and intended to encompass all the modifications within the meanings and scope that is equivalent to the claims.

Embodiment 1

Figure 1:
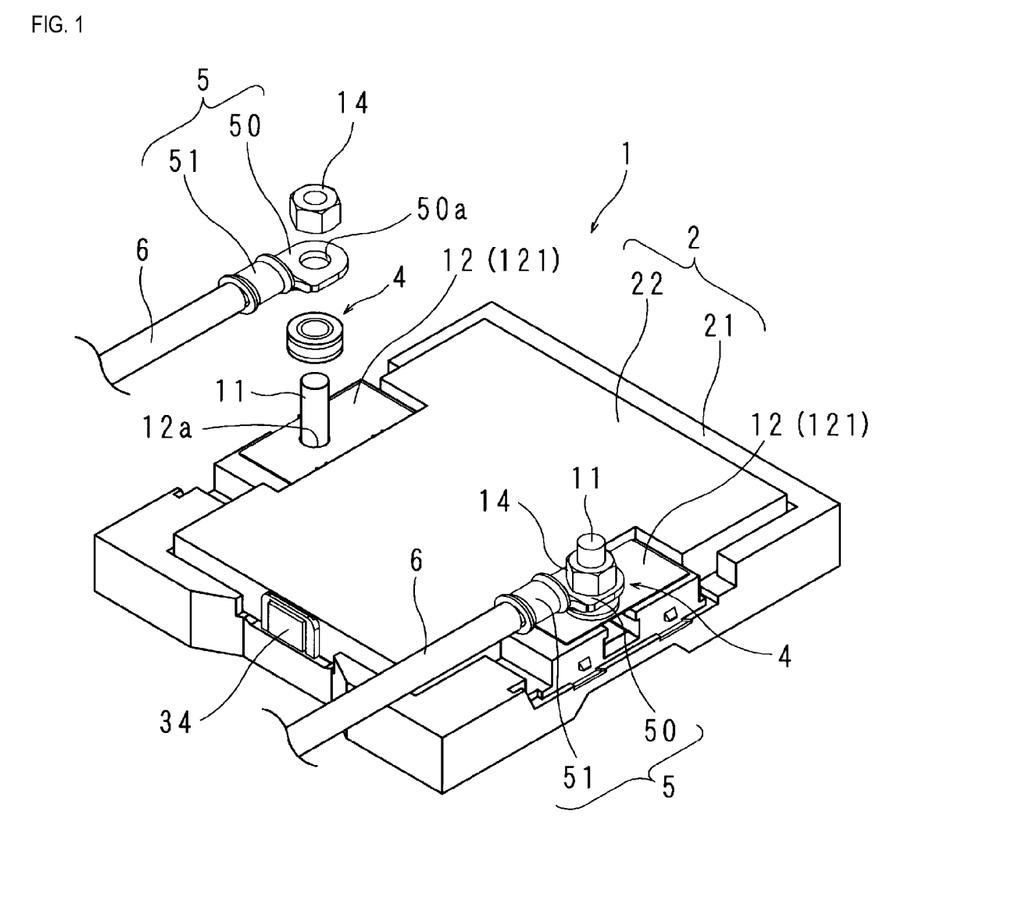
FIG. 1 is a schematic external perspective view of an electrical junction box according to embodiment 1.

FIG. 1 is a schematic external perspective view of an electrical junction box according to embodiment 1.

In the drawing, 1 denotes the electrical junction box. The electrical junction box 1 can be mounted in a vehicle. The electrical junction box 1 is mounted in an intermediate portion of an electrical circuit that connects a power source (e.g., a main battery (not shown)) and a first load (e.g., a head lump or a wiper (not shown)). A second load (e.g., a starter (not shown)) is directly connected to the power source. In a case where a large current flows from the power source to the second load, the electrical junction box 1 protects the first load from a harmful effect due to the large current by disconnecting the connection between the power source and the first load.

Figure 2:
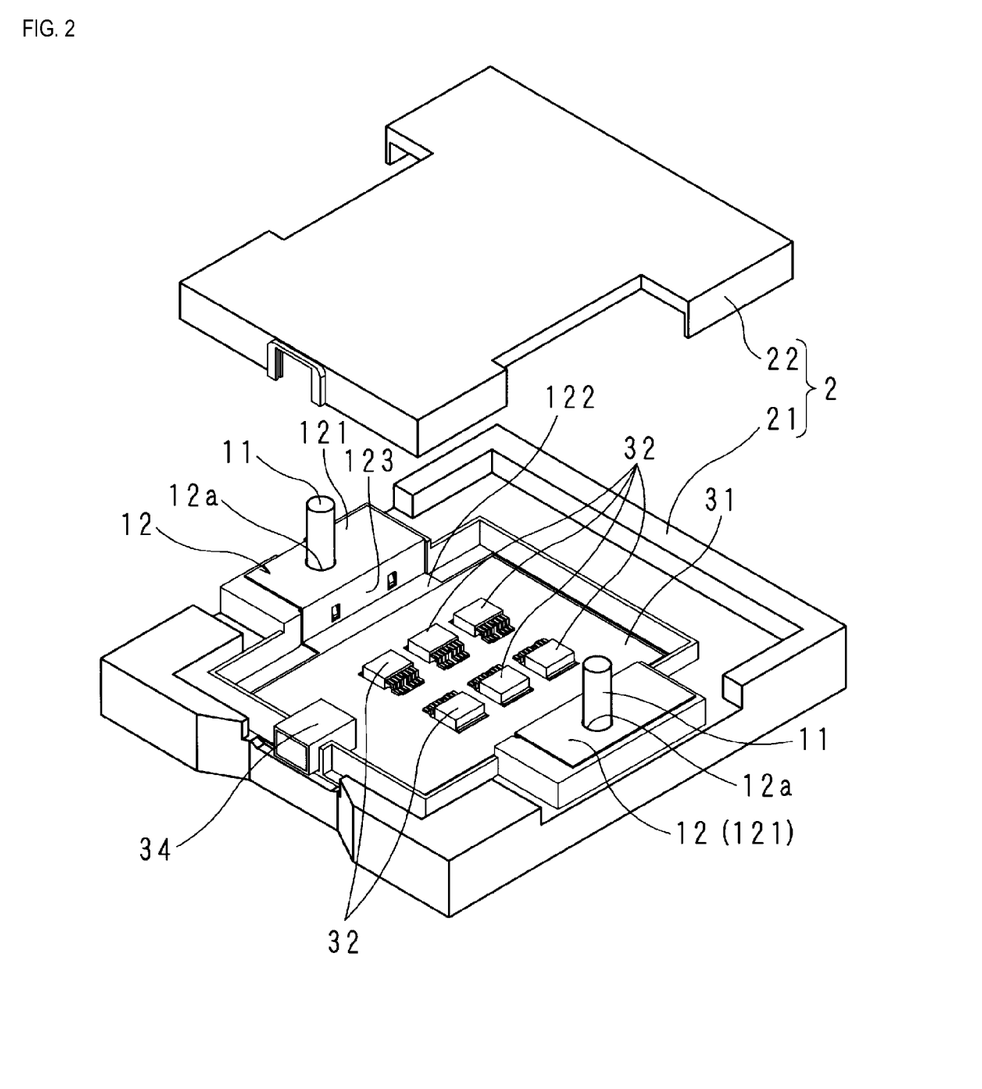
FIG. 2 is a schematic perspective view illustrating an internal configuration of the electrical junction box.
Figure 3:
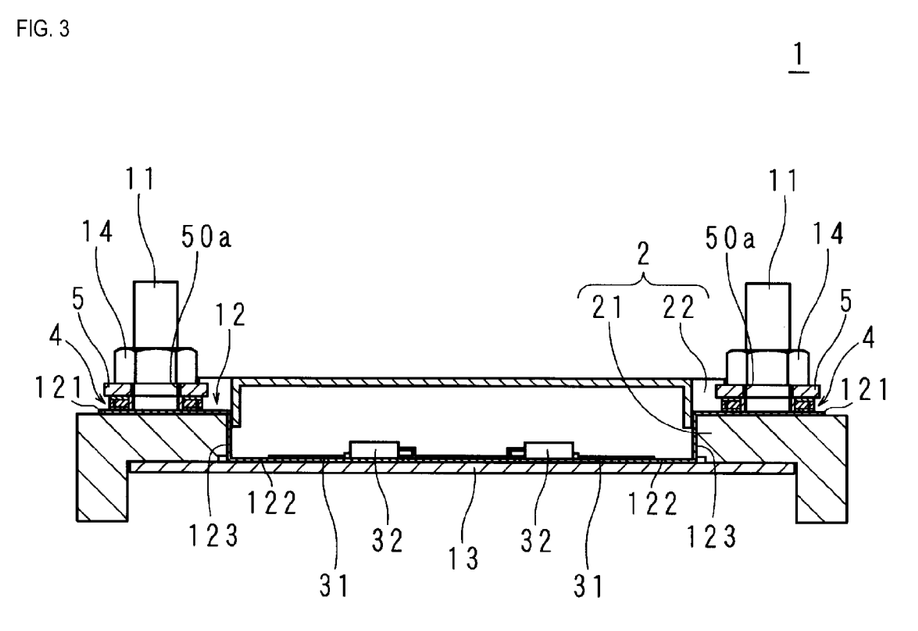
FIG. 3 is a schematic cross-sectional view of the electrical junction box.

The electrical junction box 1 includes a housing body 2. The housing body 2 includes a frame body 21 and a lid body 22. FIG. 2 is a schematic perspective view illustrating an internal configuration of an electrical junction box. FIG. 3 is a schematic cross-sectional view of the electrical junction box. FIG. 2 shows a state where the lid body 22 has been removed from the frame body 21 included in the electrical junction box 1.

The frame body 21 is shaped as a short rectangular tube. An axial direction of the frame body 21 is an up-down (vertical) direction of the drawings.

The lid body 22 is shaped as a rectangular pan. The housing body 2 is formed by the lid body 22 closing one opening (an opening on the upper side of the drawing) of the frame body 21.

In the description below, the up-down direction in the drawings indicates the up-down direction of the electrical junction box 1.

Two stud bolts 11 protrude upward from an upper end surface of the frame body 21. The two stud bolts 11 are arranged so as to face each other interposing the upper opening of the frame body 21.

Bus bars 12 are respectively attached to the stud bolts 11.

The bus bars 12 are conductive. Each of the bus bars 12 is a metal plate bent into a Z-shape, for example. The bus bar 12 includes three rectangular plates 121 to 123. The rectangular plates 121 and 122 perpendicularly protrude from the two opposite sides of the rectangular plate 123. The directions in which the rectangular plates 121 and 122 protrude are opposite to each other.

A hole 12a passes through the rectangular plate 121. The rectangular plate 121 is placed on the upper end surface of the frame body 21, and the stud bolt 11 is inserted through the hole 12a in the rectangular plate 121. The rectangular plate 123 is placed along the inner peripheral surface of the frame body 21. The rectangular plate 122 is arranged so as to be flush with the lower end surface of the frame body 21 so as to partially close the lower opening of the frame body 21.

The electrical junction box 1 further includes two ring-shaped temperature fuses 4 and 4, two connection terminals 5 and 5, and nuts 14 and 14. Two electrical wires 6 and 6 are respectively connected to the two connection terminals 5 and 5.

Figure 4:
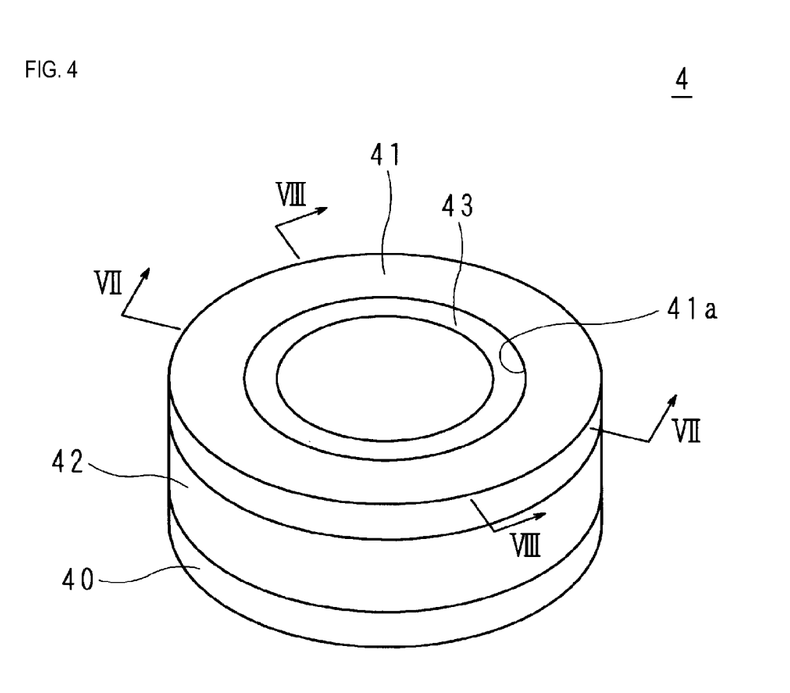
FIG. 4 is a schematic perspective view of a temperature fuse.
Figure 5:
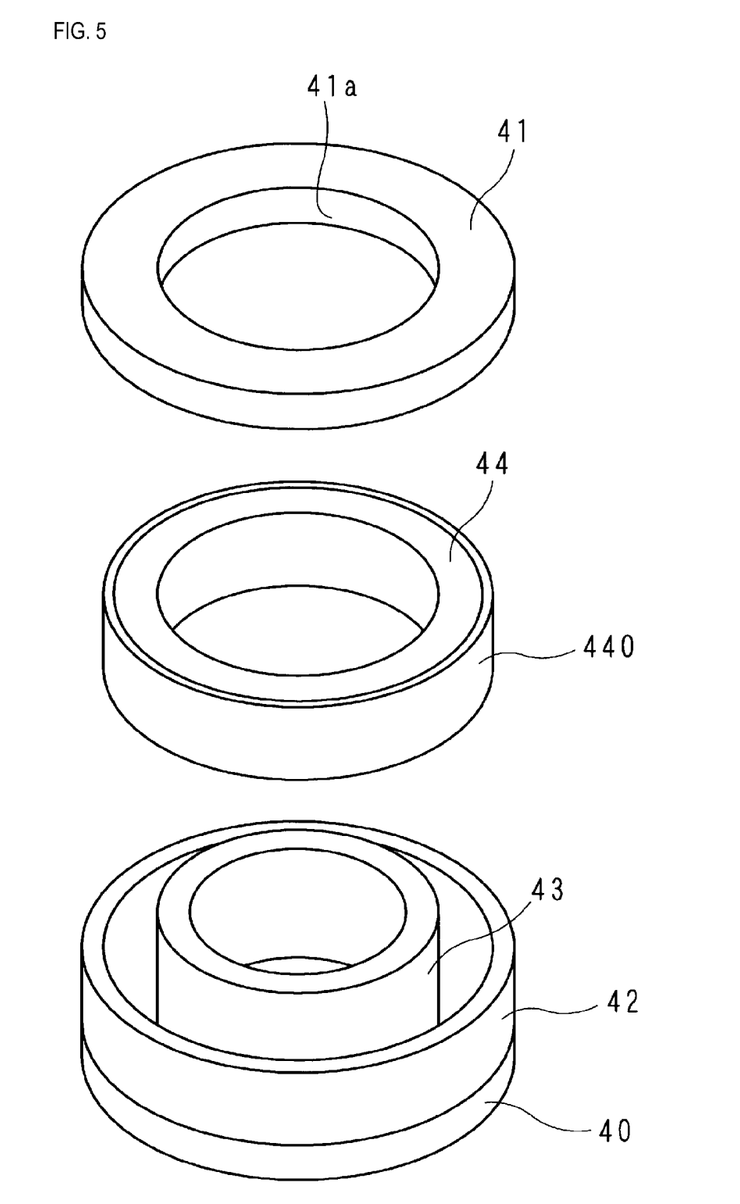
FIG. 5 is a schematic exploded perspective view of the temperature fuse.
Figure 6:
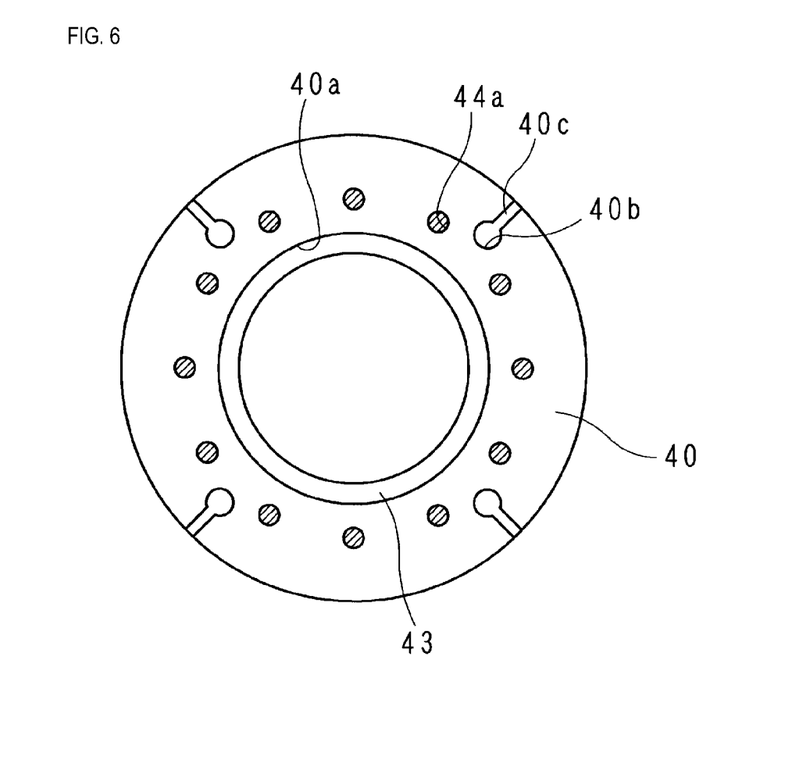
FIG. 6 is a schematic plan view of the temperature fuse.
Figure 7:
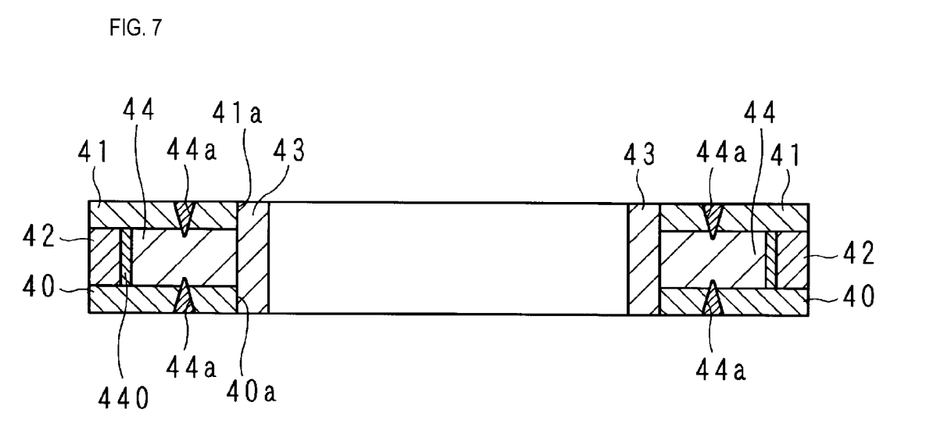
FIG. 7 is a cross-sectional view taken along line VII-VII in FIG. 4.
Figure 8:
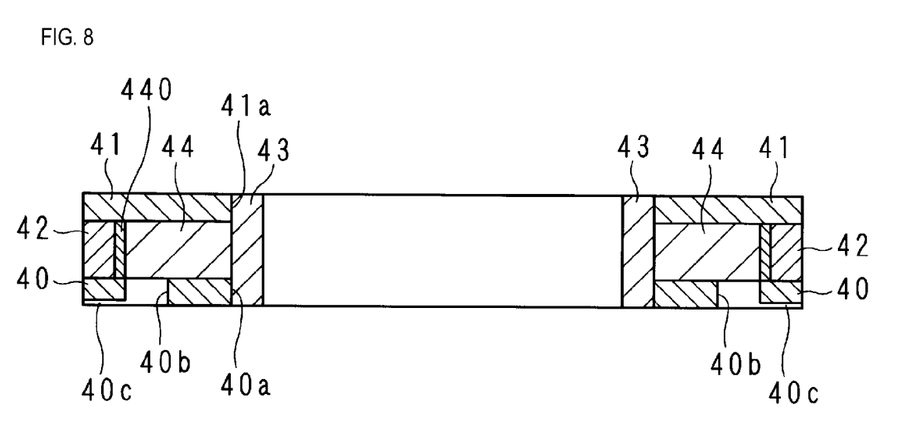
FIG. 8 is a cross-sectional view taken along line VIII-VIII in FIG. 4.

FIG. 4 is a schematic perspective view of the temperature fuse 4. FIG. 5 is a schematic exploded perspective view of the temperature fuse 4. FIG. 6 is a schematic plan view of the temperature fuse 4. FIG. 7 is a cross-sectional view taken along line VII-VII in FIG. 4. FIG. 8 is a cross-sectional view taken along line VIII-VIII in FIG. 4. The temperature fuse 4 is ring-shaped and includes two electrode plates 40 and 41, and two cylindrical insulating portions 42 and 43 and a cylindrical conductive portion 44 that are interposed between the two electrode plates 40 and 41 in the axial direction and that are arranged on an inner side an outer side in the radial direction.

The electrode plates 40 and 41 are shaped as a circular plate, and are respectively provided with through holes 40a and 41a in the center that each pass through the electrode plates 40 and 41 in the axial direction. Surfaces on one side of the electrode plates 40 and 41 oppose each other. The electrode plates 40 and 41 are made of copper or a copper alloy, for example, and the surfaces are plated with nickel, tin, or the like.

Between the opposing surfaces of the electrode plates 40 and 41, the conductive portion 44 is arranged inside in the radial direction, and the insulating portion 42 is arranged outside in the radial direction. The conductive portion 44 is formed of a soluble alloy serving as a thermal fuse element, and its outer peripheral surface is covered with a flux 440. The soluble alloy is, for example, a low-melting point alloy, having tin and bismuth as its main components. The flux 440 includes an organic acid, an activator, or the like as its components, which prevents oxidization of the soluble alloy and improves its flexibility when melted.

The inner peripheral surfaces of the electrode plates 40 and 41 are continuous with the inner peripheral surface of the conductive portion 44, and these peripheral surfaces form one surface. Also, the outer peripheral surfaces of the electrode plates 40 and 41 are continuous with the outer peripheral surface of the insulating portion 42 and these peripheral surfaces form one surface. Furthermore, the insulating portion 43 penetrates the through holes 40a and 41a of the electrode plates 40 and 41 and the conductive portion 44.

The insulating portions 42 and 43 are made of a high heat-resistant resin such as polyethylene terephthalate, polyethylene sulfide, or the like.

The electrode plates 40 and 41 are welded onto and electrically connected to the conductive portion 44 at a plurality of circular welding portions 44a (12 hatched parts at even intervals on the circle in FIG. 6). A plurality (four arranged at equidistant intervals on a circle in the drawing) of holes 40b pass through the electrode plate 40. Grooves 40c of the same number as the plurality of circular holes 40b are provided in the lower side of the electrode plate 40. Each of the grooves 40c is recessed from the lower side to the other side. One end of each groove 40c is continuous with the hole 40b and the other end is continuous with the outer peripheral surface of the electrode plate 40.

Note, that the number of the welding portions 44a and the holes 40b is not limited to that illustrated in the drawing. Also, the arrangement of the welding portions 44a and the holes 40b is not limited to that illustrated in the drawing. Furthermore, the shape of the holes 40b and the grooves 40c is not limited to that illustrated in the drawing.

The temperature fuse 4 is formed by, for example, attaching the electrode plate 40 to the insulating portions 42 and 43 through an insert molding to form a cylindrical case, arranging the conductive portion 44 between the insulating portions 42 and 43, and then attaching the electrode plate 41. After attaching the electrode plate 41, the electrode plates 40 and 41 and the conductive portion 44 are spot-soldered and electrically connected to one another by performing a laser radiation on the positions of the electrode plates 40 and 41 corresponding to the welding portions 44a.

As shown in FIG. 1, the connection terminal 5 is a round terminal, and includes a plate-shaped connection portion 50 and a tubular barrel portion 51 connected with the connection portion 50. A hole 50a passes through the connection portion 50 in the thickness direction.

The electrical wires 6 are coated electrical wires in which the periphery of their conductive portion is covered with an insulating coating. The conductive portion is, for example, a stranded wire formed by intertwining multiple thin metal wires. The insulating coating on one end portion of the electrical wires 6 has been peeled off, and the exposed conductive portion is inserted into and crimped onto the barrel portion 51 of the connection terminal 5. In this manner, the connection terminals 5 are connected with the portion at one end of the electrical wires 6.

From the bottom upward, a hole 12a in one bus bar 12, one temperature fuse 4, a hole 50a in one connection terminal 5, and one nut 14 are inserted into one stud bolt 11. The power source is connected via the electrical wire 6 connected to the one connection terminal 5. From the bottom upward, a hole 12a in the other bus bar 12, the other temperature fuse 4, a hole 50a in the other connection terminal 5, and the other nut 14 are inserted into the other stud bolt 11. The first load is connected via the other electrical wire 6 connected to the other connection terminal.

By being fastened onto the frame body 21 using the stud bolt 11 and the nut 14, the connection terminals 5 and the bus bars 12 are fixed while being in contact with the electrode plates 40 and 41, respectively, and electrically connected via the temperature fuse 4.

A heatsink 13 is attached to the lower side of the rectangular plates 122 of the bus bars 12.

The heatsink 13 has a high thermal conductivity and is made of metal, for example. The heatsink 13 is shaped as a rectangular plate. The lower side of the rectangular plates 122 of the bus bars 12 and the upper side of the heatsink 13 are adhered to each other with an adhesive agent (not shown) made of, for example, a thermosetting synthetic resin. Due to the adhesive agent hardening, an adhesive layer (not shown) is formed between the bus bars 12 and the heatsink 13. This adhesive layer is electrically insulating, and does not prevent heat conduction from the bus bars 12 to the heatsink 13.

The heatsink 13 attached to the two bus bars 12 covers the lower side of the frame body 21 and closes the lower opening of the frame body 21. In this manner, the frame body 21 and the heatsink 13 form a box body having the frame body 21 serving as a peripheral wall and the heatsink 13 serving as a bottom wall.

Note, that heat dissipation fins may also be provided on the lower side of the heatsink 13.

The electrical junction box 1 further includes a circuit board 31. The circuit board 31 is attached to the upper side of the rectangular plate 122 of the bus bars 12 with one side facing downward.

Six switching elements 32 and a control element (not shown) are mounted on the upper side of the circuit board 31. The six switching elements 32 are, for example, FETs (field effect transistors). The six switching elements 32 are provided in sets of two. The source terminals of one pair of switching elements 32 are connected to each other, for example. In this case, the drain terminals of the pair of switching elements 32 are connected to the different bus bars 12. The gate terminals of the switching elements 32 are connected to the control element 33.

The pairs of switching elements 32 are arranged in the direction in which the two stud bolts 11 face each other, and the three pairs of switching elements 32 are lined up in the direction perpendicular to this direction.

When all the switching elements 32 are ON, the two bus bars 12 are connected to each other. At this time, a current flows from the power source via the three pairs of switching elements 32 to the first load. The amount of the current flowing through one pair of the switching elements 32 is one-third that of the current flowing through the bus bar 12. That is, the amount of current flowing through the individual switching elements 32 can be reduced by using three pairs of switching elements 32.

If all the switching elements 32 are OFF, no current flows through the switching elements 32, and thus the two bus bars 12 are disconnected. At this time, the power source and the first load are disconnected. When the power source and the first load are disconnected, an auxiliary power source (e.g., a sub battery which is not shown) that is directly connected to the first load supplies power to the first load.

In one pair of the switching elements 32, the forward direction of a parasitic diode included in one switching element 32 is opposite to the forward direction of a parasitic diode included in the other switching element 32. Accordingly, when all the switching elements 32 are OFF, the two bus bars 12 are not connected through the parasitic diodes included in the six switching elements 32.

Note, that the switching elements 32 are not limited to FETs. Also, the number of switching elements 32 is not limited to six and may also be any number more than one. Furthermore, the switching elements 32 are not limited to being provided in sets of two. It is sufficient if at least one switching element 32 is interposed between the two bus bars 12.

The control element is, for example, an MPU (microprocessing unit) or the like, and switches the switching elements 32 between ON and OFF. The control element is connected to a connector 34 provided on the peripheral edge portion of the circuit board 31. A control signal is input from the outside of the electrical junction box 1, via a signal line (not shown) connected to the connector 34, to the control element.

The switching elements 32 are switched ON and OFF in response to the control signal input to the control element. If the control signal indicating that the starter starts the operation is input, for example, the control element switches all the switching elements 32 OFF. After the engine is started by the starter, the control element switches all the switching elements 32 ON.

The electrical junction box 1 further includes a temperature sensor which is not shown. The temperature sensor detects the temperature of the six switching elements 32. The temperature detection result from the temperature sensor is supplied to the control element, and if the temperature exceeds a predetermined upper limit temperature, the control element switches all the switching elements 32 OFF to protect the six switching elements 32 from overheating. The predetermined upper limit temperature is lower than the temperature of the six switching elements 32 in the overheated state. The control element keeps the six switching elements 32 OFF at least until the temperature of the six switching elements 32 becomes lower than a predetermined safe temperature. The predetermined safe temperature is a temperature that is sufficiently lower than the predetermined upper limit temperature.

Note, that the electrical junction box 1 may also be provided with a current sensor. The current sensor detects a current flowing through the switching elements 32. If a current higher than the upper limit value that is lower than the overcurrent flows through the switching elements 32, the control element switches the switching elements 32 OFF. In other words, the control element protects the six switching elements 32 from overheating by protecting the six switching elements 32 from an overcurrent.

The peripheral wall of the lid body 22 has a cutout concave portion. A portion of the connector 34 (specifically, a portion for connecting the connector 34 with the above-described signal line) is exposed, from an opening formed by the cutout concave portion and the frame body 21, to the outside of the housing body 2. The two stud bolts 11, the rectangular plates 121 of the bus bars 12, and the heatsink 13 are exposed to the outside of the housing body 2.

In the electrical junction box 1 described above, the switching elements 32 generate heat when a current flows through them. The heat generated by the switching elements 32 is transmitted to the circuit board 31, the bus bars 12, and the heatsink 13, and then dissipated from the heatsink 13 to the outside of the electrical junction box 1. When not overheated, the temperature of the switching elements 32 is low.

Here, the state of being overheated will be illustrated. Overheating of the switching elements 32 can occur in case of an emergency in which, for example, an error occurs in the control element and the switching elements 32 are no longer protected from overheating by the control element. When being overheated, the temperature of the switching elements 32 is high. The heat generated by the switching elements 32 is transmitted via the bus bars 12 to the temperature fuse 4.

At this time, an overcurrent flows through the electrical wire 6, and the heat transmitted to the temperature fuse 4 melts the conductive portion 44. The melted soluble alloy flows out from the hole 40b to the exterior. Here, the electrode plates 40 and 41 are separated by a predetermined distance by the insulating portions 42 and 43, and thus the electrode plates 40 and 41 are insulated. Accordingly, the bus bars 12 and the connection terminal 5 are insulated, and the current is interrupted. Accordingly, the power source and the load are protected from the overcurrent.

According to the above configuration, the temperature fuse 4 can be easily attached by inserting the stud bolt 11 therethrough and arranging it between the connection terminal 5 and the bus bar 12, making it possible to save space. Accordingly, the electrical junction box 1 can be made smaller. Also, when an overcurrent flows between the connection terminal 5 and the bus bars 12, the conductive portion 44 melts, the gap is kept by the insulating portion 42 and 43, and the connection terminal 5 and the bus bars 12 are thus insulated. Accordingly, the temperature fuse 4 can interrupt a current with a simple configuration.

Since the conductive portion 44 is interposed between the two insulating portions 42 and 43, if the conductive portion 44 melts, it is possible to keep the connection terminal 5 and the bus bars 12 more reliably insulated from each other. Since the two electrode plates 40 and 41 are provided with the insulating portions 42 and 43 and the conductive portion 44 interposed therebetween in the axial direction and having the through holes 40a and 41a, it is possible to connect the connection terminal 5 and the bus bars 12 with the electrode plates 40 and 41, and the electrical connection via the temperature fuse 4 can be easily ensured.

Since the hole 40b passes through the electrode plate 40, if the conductive portion 44 melts, the melted thermal fuse element can flow out from the hole 40b.

Note, that the electrical junction box 1 is not limited to an in-vehicle device. The electrical junction box 1 may also have a configuration in which electrical power from the power source is selectively distributed to multiple loads. Also, the temperature fuse 4 need only be ring-shaped as a whole, and may also be shaped as a polygonal ring such as a triangular or square ring, or an oval ring.

Furthermore, a configuration is also possible in which a hole passing through a side surface of the insulating portions 42 or the insulating portions 43 is provided instead of providing the hole 40b in the electrode plate, and the melted soluble alloy flows out from this hole. At this time, it is possible to suitably cause the melted soluble alloy to flow out by providing the hole in the lower portion (a portion on the bus bar 12 side) of the side surface.

Furthermore, a configuration is also possible in which no grooves 40c are provided in the electrode plate 40. Also, only one of the insulating portions 42 and 43 may be provided instead of providing both. Furthermore, the insulating portions 42 and 43 and the conductive portion 44 may also be formed by multiple separate members separated in the peripheral direction instead of a single continuous member.

Embodiment 2

In embodiment 1, the temperature fuse 4 is shaped as a complete ring, but the temperature fuse 4 may also be shaped as an incomplete ring, such as a shape of C.

Hereinafter, aspects of embodiment 2 which are different from embodiment 1 will be described. Since the configuration other than the later-described configuration is the same as that of embodiment 1, the constituent portions that are the same as in embodiment 1 are given the same reference signs as that of embodiment 1 and the description thereof will be omitted.

Figure 9:
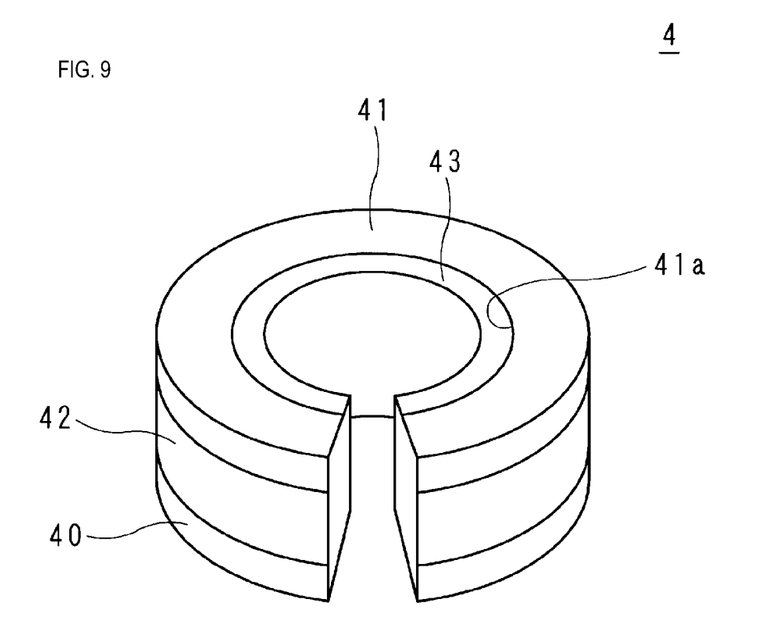
FIG. 9 is a schematic perspective view of a temperature fuse according to embodiment 2.

FIG. 9 is a schematic perspective view of a temperature fuse according to embodiment 2. The temperature fuse 4 according to embodiment 2 is a C-shaped incomplete ring. Like in embodiment 1, the temperature fuse 4 is provided with the two electrode plates 40 and 41, the two insulating portions 42 and 43 and the conductive portion 44 interposed between the two electrode plates 40 and 41. Although they each have the same configuration as that of embodiment 1, they are shaped as tubular bodies having a C-shaped cross section. The two end portions of the C-shape of the temperature fuse 4 may also be covered and protected with the insulating film or the like, for example.

According to the above configuration, since the temperature fuse 4 is a C-shaped incomplete ring, the temperature fuse 4 can be easily attached to the stud bolt 11. Also, the temperature fuse 4 according to embodiment 2 can achieve the same effect achieved by the temperature fuse according to embodiment 1, and can interrupt a current with a simple configuration.

In embodiment 2, the temperature fuse 4 may also be U-shaped or the like, and the temperature fuse 4 configured in this manner can also achieve the same effect.

Embodiments 1 and 2 are illustrative examples in all aspects and should not be considered as restrictive. The scope of the present disclosure is defined not by the above descriptions but by the claims, and intended to encompass all the modifications within the meanings and scope of the equivalents of the claims.

The invention claimed is:

1. A temperature fuse that is ring-shaped and includes:
an outer insulating portion and an inner insulating portion, the outer insulating portion is concentric to and spaced apart from the inner insulating portion and a conductive portion, the conductive portion being a cylindrical member having an outer surface and an inner surface, the inner surface defining a bore, the conductive portion interposed between the outer insulating portion and the inner insulating portion, wherein the outer surface of the conductive portion is flush against an inner surface of the outer insulating portion and the inner surface of the conductive portion is flush against an outer surface of the inner insulating portion,
wherein the conductive portion is formed of a thermal fuse element.

2. The temperature fuse according to claim 1, having a shape of an incomplete ring.

3. An electrical junction box including:
a circuit board on which a switching element is mounted;
a housing body for housing the circuit board;
a conductive plate connected to the switching element, a first hole passing through the conductive plate;
a terminal that is shaped as a plate and faces the conductive plate, a second hole passing through the terminal;
the temperature fuse according to claim 1, interposed between the conductive plate and the terminal in an axial direction, and
a shaft-like insertion body that is inserted into the temperature fuse, the first hole, and the second hole.

4. The temperature fuse according to claim 1, wherein the conductive portion includes a flux defining the outer surface.

5. A temperature fuse including:
an outer insulating portion and an inner insulating portion, the outer insulating portion is concentric to and spaced apart from the inner insulating portion and a conductive portion being a cylindrical member having an outer surface and an inner surface, the inner surface defining a bore, the conductive portion interposed between the outer insulating portion and the inner insulating portion, wherein the outer surface of the conductive portion is flush against an inner surface of the outer insulating portion and the inner surface of the conductive portion is flush against an outer surface of the inner insulating portion,
two electrode plates that are ring-shaped, wherein the outer insulating portion, the inner insulating portion and the conductive portion interposed between the two electrode plates in an axial direction,
wherein the conductive portion is formed of a thermal fuse element, and the electrode plates are each provided with a hole at a position corresponding to the conductive portion of the electrode plate.

6. The temperature fuse according to claim 5, wherein the electrode plates are each provided with a groove connecting the hole with an outer periphery.

7. The temperature fuse according to claim 6, having a shape of an incomplete ring.

8. The temperature fuse according to claim 5, having a shape of an incomplete ring.

9. The temperature fuse according to claim 5, wherein the conductive portion includes a flux defining the outer surface.

* * * * *